(12) United States Patent
Wang

(10) Patent No.: US 11,302,751 B2
(45) Date of Patent: Apr. 12, 2022

(54) PIXEL UNIT, PIXEL STRUCTURE, AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Kun Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 259 days.

(21) Appl. No.: 16/623,539

(22) PCT Filed: Oct. 18, 2019

(86) PCT No.: PCT/CN2019/111797
§ 371 (c)(1),
(2) Date: Dec. 17, 2019

(87) PCT Pub. No.: WO2021/000454
PCT Pub. Date: Jan. 7, 2021

(65) Prior Publication Data
US 2021/0408155 A1    Dec. 30, 2021

(30) Foreign Application Priority Data
Jul. 4, 2019 (CN) .......................... 201910600943.0

(51) Int. Cl.
*G09G 3/36* (2006.01)
*H01L 27/32* (2006.01)
(Continued)

(52) U.S. Cl.
CPC ....... *H01L 27/3218* (2013.01); *G09G 3/2003* (2013.01); *G09G 3/3225* (2013.01);
(Continued)

(58) Field of Classification Search
CPC . H01L 27/3218; H01L 27/3216; H01L 51/56; G09G 3/3225; G09G 3/32; G09G 3/36; G09G 3/34
See application file for complete search history.

(56) References Cited

U.S. PATENT DOCUMENTS

2005/0041188 A1* 2/2005 Yamazaki ........... H01L 27/3213
349/146
2009/0109172 A1* 4/2009 Lee ........................ G09G 3/344
345/107
(Continued)

FOREIGN PATENT DOCUMENTS

CN    204332961 U    5/2015
CN    105552099 A    5/2016
(Continued)

*Primary Examiner* — Pegeman Karimi
(74) *Attorney, Agent, or Firm* — Osha Bergman Watanabe & Burton LLP

(57) ABSTRACT

A pixel unit, a pixel structure and manufacturing method thereof, wherein the pixel unit includes a first sub-pixel, a second sub-pixel, and a third sub-pixel arranged to form a polygon. The third sub-pixel is disposed in a rectangular boundary of the polygon, the first sub-pixel and the second sub-pixel are respectively disposed at two sides of the rectangular boundary. A pixel area of the third sub-pixel is larger than a pixel area of the first sub-pixel and the second sub-pixel. The first sub-pixel is red, the second sub-pixel is green, and the third sub-pixel is blue.

12 Claims, 8 Drawing Sheets

(51) Int. Cl.
*G09G 3/20* (2006.01)
*G09G 3/3225* (2016.01)
*H01L 51/56* (2006.01)

(52) U.S. Cl.
CPC .......... *H01L 27/3216* (2013.01); *H01L 51/56* (2013.01); *G09G 2300/0452* (2013.01)

(56) References Cited

U.S. PATENT DOCUMENTS

| | | | |
|---|---|---|---|
| 2014/0077186 A1* | 3/2014 | Kim | H01L 27/3218 257/40 |
| 2015/0015465 A1* | 1/2015 | Gong | G09G 3/3208 345/76 |
| 2016/0126298 A1 | 5/2016 | Chen | |
| 2016/0293678 A1* | 10/2016 | Wang | H01L 27/12 |
| 2017/0249889 A1 | 8/2017 | Wang et al. | |
| 2018/0226021 A1* | 8/2018 | Jin | G09G 3/3208 |
| 2019/0148470 A1* | 5/2019 | Takagi | H01L 27/3251 257/40 |
| 2020/0075691 A1* | 3/2020 | Zhou | H01L 51/0011 |
| 2020/0385856 A1* | 12/2020 | Yamabuchi | H01L 51/0011 |

FOREIGN PATENT DOCUMENTS

| | | |
|---|---|---|
| CN | 106205543 A | 12/2016 |
| CN | 109859666 A | 6/2019 |

\* cited by examiner

PIXEL UNIT, PIXEL STRUCTURE, AND MANUFACTURING METHOD THEREOF

FIELD OF THE DISCLOSURE

The present invention relates to display devices and in particular, to a pixel unit, a pixel structure, and a manufacturing method of the pixel structure

DESCRIPTION OF THE RELATED ART

In organic light emitting diode (OLED) display technologies, pixelation is a well-developed technique having red (R), green (G), and blue (B) sub-pixels arranged side-by-side. Because red, green and blue organic luminescent materials are different in their service life and efficiencies. Especially, the service life and efficiency of the blue organic luminescent material is far less than those of the green and blue luminescent materials. In a conventional RGB layout, each sub-pixel has the same pixel area. As a result, during the use of a product, brightness of the blue sub-pixel will decline in advance, resulting in poor display quality or display operation failures.

In order to solve the problem of different service lives of the sub-pixels of an OLED display, different sub-pixels have different aperture ratios/pixel areas, and the blue sub-pixels and the red sub-pixels have the largest aperture ratio, which makes up for the shortcomings of different service lives and efficiencies. As shown in FIG. 1A, in a conventional Pen-Tile-type sub-pixel layout, when an image is displayed, one sub-pixel and the adjacent two sub-pixels of different colors constitute three primary colors. For example, in a horizontal direction, each sub-pixel and adjacent sub-pixels share their colors to display a white picture. The Pentile technique effectively solves the problem of different service lives of the red, green and blue luminescent materials of the sub-pixels. However, in conventional techniques, as shown in FIG. 1B, since the sub-pixels at edges are only red sub-pixels and blue or are all green sub-pixels, chromatic dispersion is inevitably caused during display operations. Although the PenTile technique will correct this problem by making the sub-pixels that should have been extinguished lit up to display the normal color, the original flat edges are no longer flat but serrated, thus causing a PenTile screen to have a burr problem at its edges.

As shown in FIG. 1A, in a conventional PenTile-type sub-pixel layout, when an image is displayed, one sub-pixel and the adjacent two sub-pixels of different colors constitute three primary colors. For example, in a horizontal direction, each sub-pixel and adjacent sub-pixels share their colors to display a white picture. The Pentile technique effectively solves a problem of different service lives of red, green and blue luminescent materials of the sub-pixels. However, in conventional techniques, as shown in FIG. 1B, since the sub-pixels at edges are only red and blue sub-pixels or are all green sub-pixels, chromatic dispersion is inevitably caused during display operations. Although the PenTile technique corrects this problem by making the sub-pixels that should have been extinguished lit up to display the normal color, the original flat edges are no longer flat but serrated, thus causing a PenTile screen to have a burr problem at its edges.

SUMMARY

The present invention provides a pixel unit, a pixel structure, and a manufacturing method of the pixel structure to prolong a service life and improve luminous efficiency of a third sub-pixel, increase an overall aperture ratio of a pixel unit, and avoid chromatic dispersion and serrated edges.

Accordingly, the present invention provides a pixel unit comprising:

a first sub-pixel, a second sub-pixel, and a third sub-pixel arranged to form a polygon. The third sub-pixel is disposed in a rectangular boundary of the polygon, the first sub-pixel and the second sub-pixel are respectively disposed at two sides of the rectangular boundary. A pixel area of the third sub-pixel is larger than a pixel area of the first sub-pixel and the second sub-pixel. The first sub-pixel is red, the second sub-pixel is green, and the third sub-pixel is blue.

Preferably, the polygon is regular hexagonal, regular octagonal, or regular decagonal in shape.

Preferably, when the polygon is regular hexagonal in shape, the first sub-pixel and the second sub-pixel are triangular; when the polygon is regular octagonal in shape, the first sub-pixel and the second sub-pixel are trapezoidal; and when the polygon is regular decagonal in shape, the first sub-pixel and the second sub-pixel are polygonal.

Preferably, further comprising a fourth sub-pixel arranged connected to an outer boundary of the polygon, wherein when the polygon is regular octagonal or regular decagonal in shape, the fourth sub-pixel is connected to one side of an outer boundary of the third sub-pixel, wherein the fourth sub-pixel is white.

Preferably, further comprising a pixel defining matrix which spaces the first sub-pixel, the second sub-pixel, and the third sub-pixel apart from each other, wherein the pixel defining matrix is black.

The present invention further provides a pixel unit structure. The pixel unit structure comprises multiple pixel units as mentioned above, wherein each of the pixel units comprises a pixel defining matrix which spaces the first sub-pixel, the second sub-pixel, and the third sub-pixel apart from each other, the pixel units are arranged linearly in a longitudinal direction and in a transverse direction.

Preferably, the polygon is regular hexagonal, regular octagonal, or regular decagonal in shape.

Preferably, when the polygon is regular hexagonal in shape, each of the pixel units is connected to form the pixel structure without a gap.

Preferably, when each of the polygons is regular octagonal in shape, a plurality of fourth sub-pixels are rectangular and connected to outer boundaries of the pixel units.

Preferably, when each of the polygons is regular decagonal in shape, a plurality of fourth sub-pixels are triangular and connected to outer boundaries of the pixel units.

Moreover, the present invention provides a manufacturing method of a pixel structure, comprising steps as follows:

forming a plurality of pixel units which are each in a shape of a polygon, each of the pixel units defines a first opening area, a second opening area, and a third opening area;

forming first sub-pixels by performing evaporation or inkjet printing through a first fine metal mask arranged corresponding to the first opening areas, wherein the first fine metal mask comprises a plurality of first vapor deposition holes;

forming second sub-pixels by performing evaporation or inkjet printing through a second fine metal mask arranged corresponding to the second opening areas, wherein the second fine metal mask comprises a plurality of second vapor deposition holes; and forming third sub-pixels by performing evaporation or inkjet printing through a third fine metal mask arranged corresponding to the third opening areas, wherein the third fine metal mask comprises a plurality of third vapor deposition holes;

wherein each of the third sub-pixels is formed inside a rectangular boundary of the polygon, and each of the first sub-pixels and each of the second sub-pixels are respectively formed on two sides of the rectangular boundary, a pixel area of each of the third sub-pixels is larger than a pixel area of each of the first sub-pixels and each of the second sub-pixels, the first sub-pixel is red, the second sub-pixel is green, and the third sub-pixel is blue.

Preferably, in the step of forming the pixel units which are each in a shape of a polygon, the manufacturing method further comprises forming a pixel defining matrix in each of the first sub-pixels, each of the second sub-pixels, and each of the third sub-pixels, wherein the polygon is regular hexagonal, regular octagonal, or regular decagonal in shape.

Preferably, when the polygon is regular octagonal or regular decagonal in shape, a plurality of fourth sub-pixels is connected to outer boundaries of the pixel units.

Preferably, the fourth sub-pixel is white, and the pixel defining matrix is black.

Advantageous effects of the present invention: The white sub-pixel is inserted between the pixel units, and the white sub-pixel together with the adjacent red, green and blue sub-pixels forms a new pixel point, thereby forming the pixel structure having RGBW sub-pixels. Therefore, the present invention can improve the brightness and color of a picture, effectively save power consumption, prolong the service life of an organic light-emitting display, and improve a pixel aperture ratio of the entire display panel. Compared with conventional techniques, the manufacturing method of the preset embodiment saves at least one fine metal mask, and reduces production costs and manufacturing time.

BRIEF DESCRIPTION OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, a person having ordinary skill in this field can obtain other figures according to these figures without an inventive work or paying the premise.

DETAILED DESCRIPTION OF THE EMBODIMENTS

References to "embodiment" in the detailed description mean that the specific features, structures or characteristics described in connection with the embodiments may be included in at least one embodiment of the invention. The same terms appearing in different places in the specification are not necessarily limited to the same embodiment, but should be understood as independent or alternative embodiments to other embodiments. In view of the technical solutions disclosed in the embodiments of the present invention, those skilled in the art should understand that the embodiments described herein may have other combinations or modifications in accordance with the embodiments of the present invention.

Figure 1A:
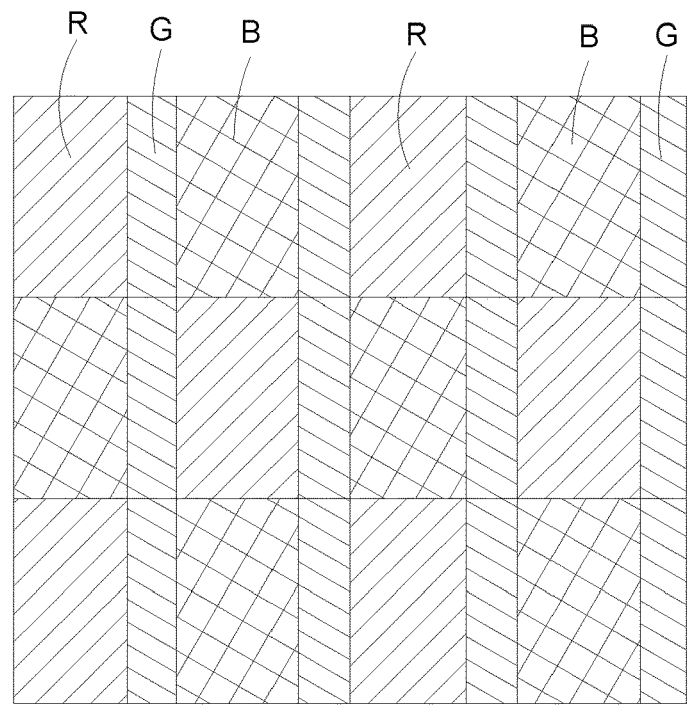
FIG. 1A is a schematic view illustrating a pixel structure according to one embodiment of a prior art.
Figure 1B:
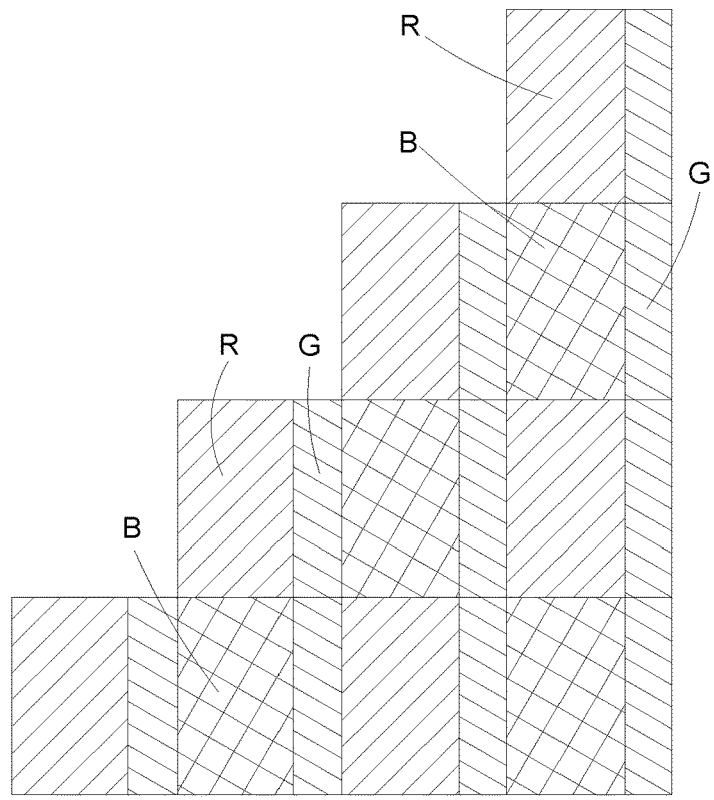
FIG. 1B is another schematic view illustrating the pixel structure according to another embodiment of the prior art.
Figure 2:
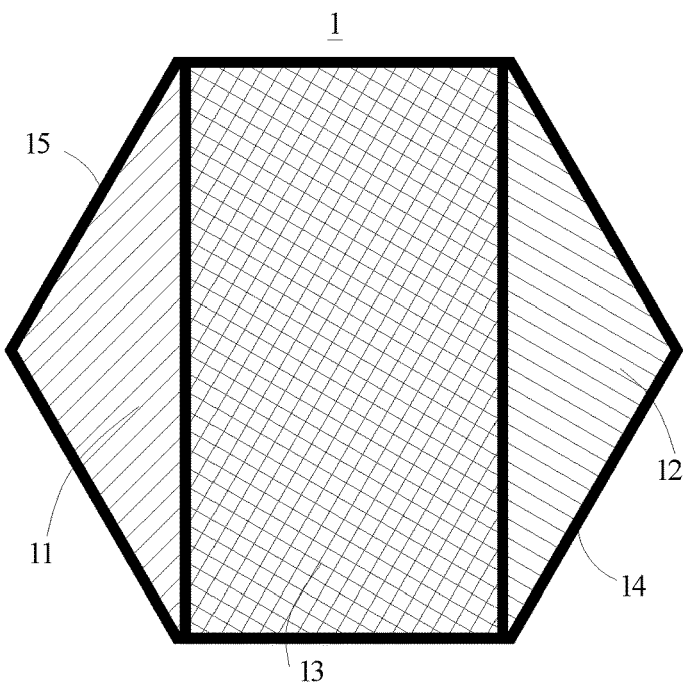
FIG. 2 is a schematic planar view illustrating a pixel unit according to the present invention.
Figure 3:
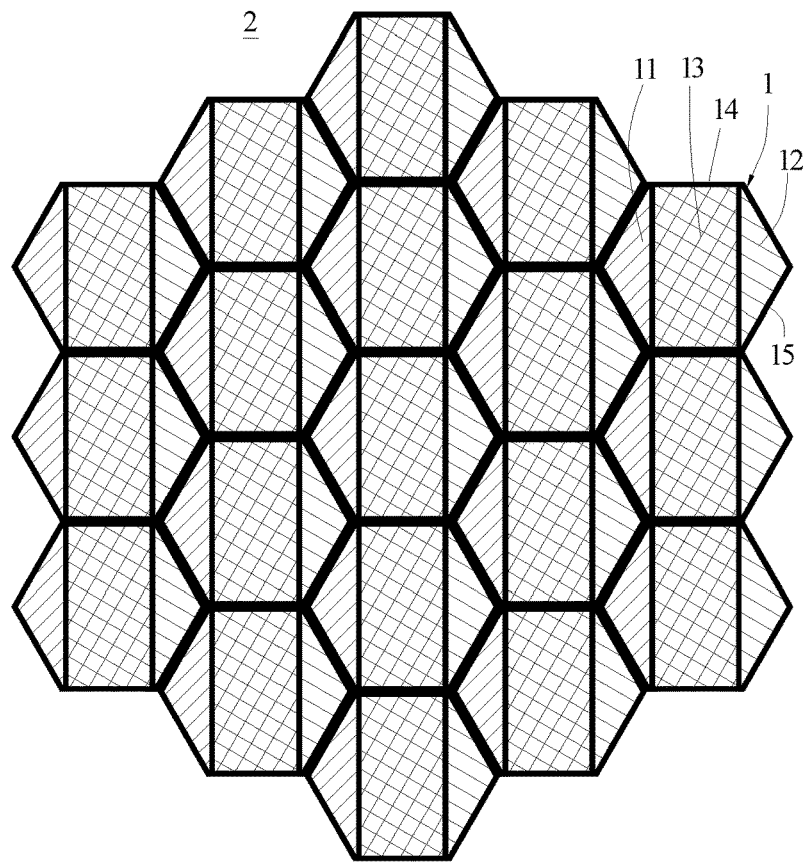
FIG. 3 is a schematic planar view illustrating a pixel structure constituted by multiple pixel units according to the present invention.

Please refer to FIG. 2 and FIG. 3. FIG. 2 is a schematic planar view illustrating a pixel unit according to the present invention. FIG. 3 is a schematic planar view illustrating a pixel structure constituted by multiple pixel units according to the present invention. As shown in FIG. 2 and FIG. 3, the present invention provides a pixel unit 1 comprising a first sub-pixel 11, a second sub-pixel 12, and a third sub-pixel 13 arranged to form a polygon 14. The third sub-pixel 13 is disposed inside a rectangular boundary (not illustrated) of the polygon 14, the first sub-pixel 11 and the second sub-pixel 12 are respectively disposed at two sides of the rectangular boundary. A pixel area of the third sub-pixel 13 is larger than a pixel area of the first sub-pixel 11 and the second sub-pixel 12. The first sub-pixel 11 is red, the second sub-pixel 12 is green, and the third sub-pixel 13 is blue.

Figure 5:
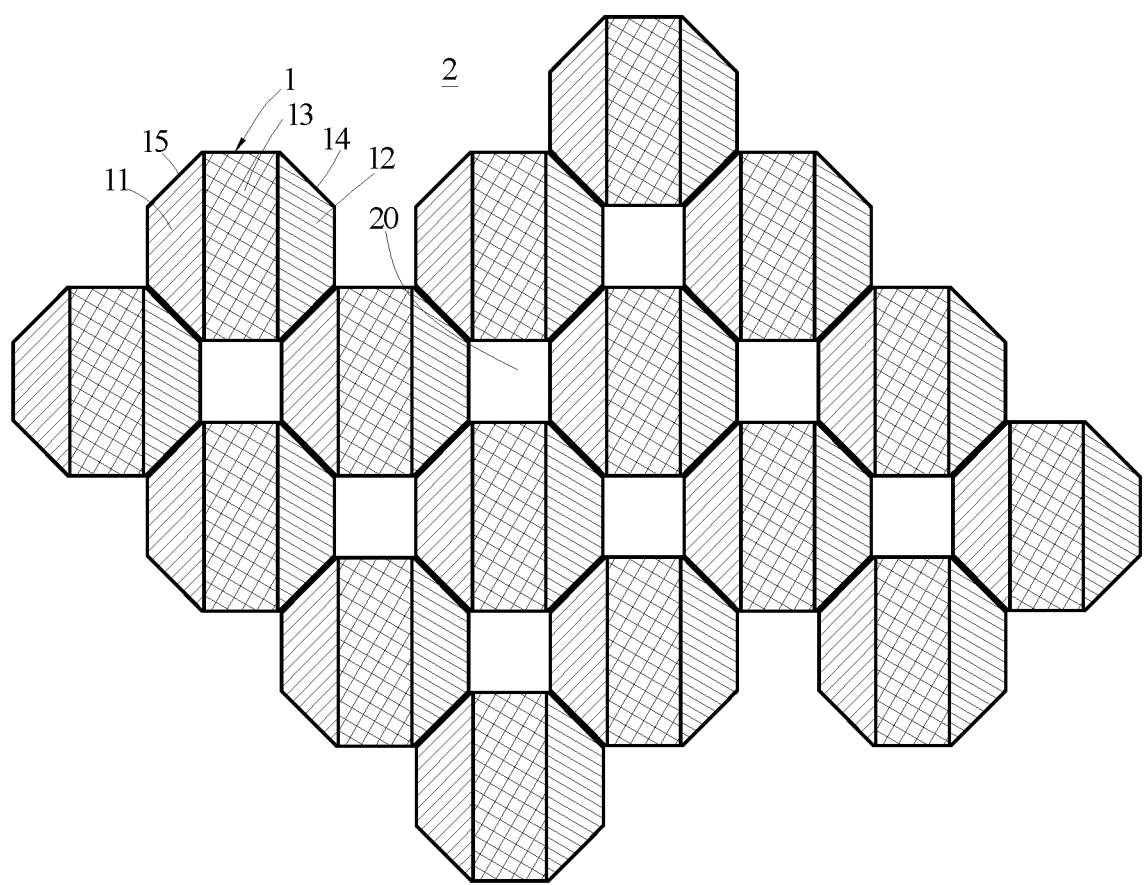
FIG. 5 is another schematic planar view illustrating the pixel structure constituted by multiple pixel units according to the present invention.
Figure 6:
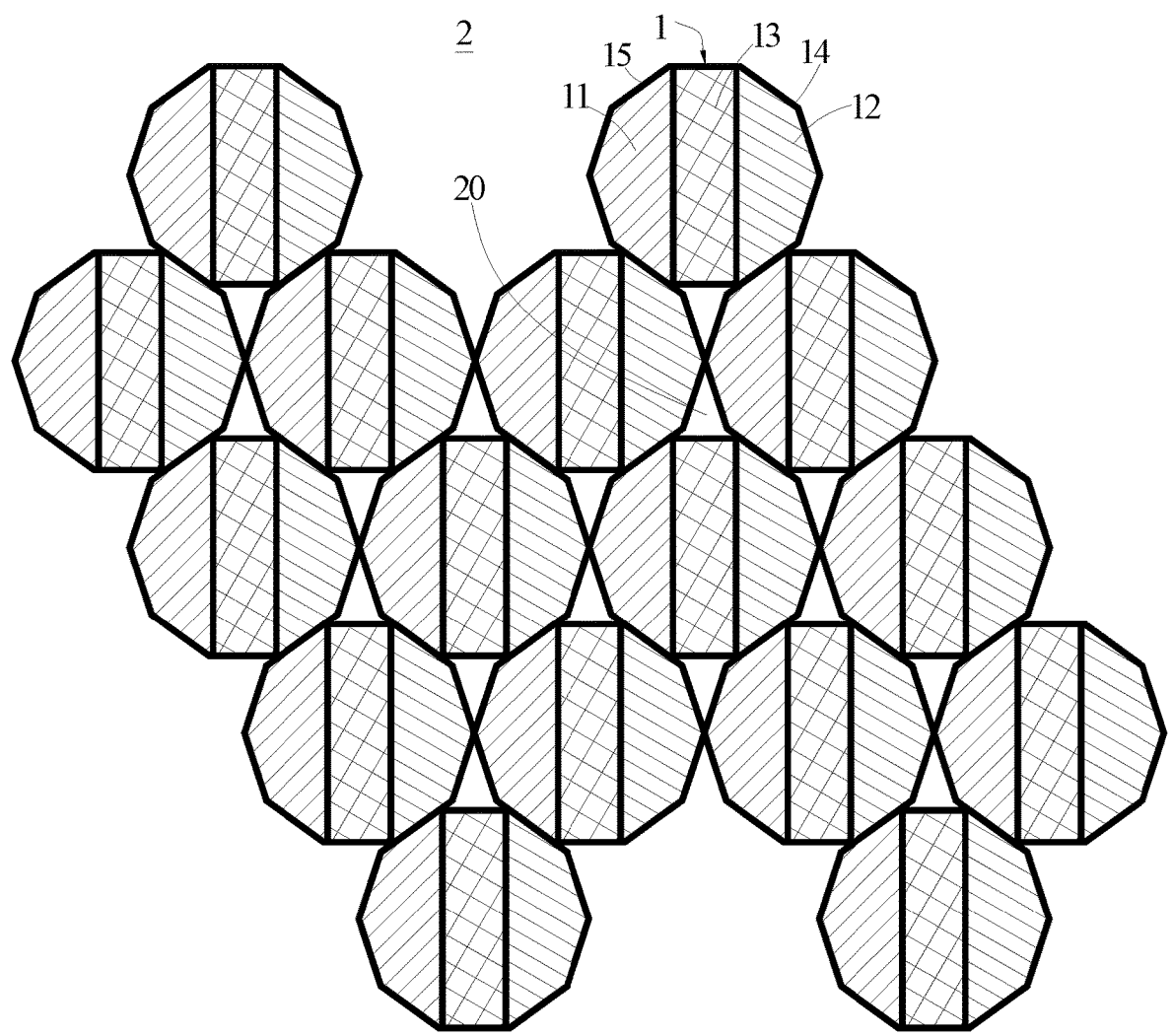
FIG. 6 is still another schematic planar view illustrating the pixel structure constituted by multiple pixel units according to the present invention.

In a first embodiment as shown in FIG. 2 and FIG. 3, the polygon 14 is preferably regular hexagonal in shape. However, in a second embodiment as shown in FIG. 5, the polygon 14 of the one single pixel unit 1 can also be regular octagonal in shape, and in a third embodiment as shown in FIG. 6, the polygon 14 of one single pixel unit 1 may also be regular decagonal in shape; configuration may vary as required. In the first, second, and third embodiments, the pixel unit 1 further comprises a pixel defining matrix 15 which spaces the first sub-pixel 11, the second sub-pixel 12, and the third sub-pixel 13 apart from each other, wherein the pixel defining matrix 15 is black.

When the polygon 14 is regular hexagonal in shape, the first sub-pixel 11 and the second sub-pixel 12 are triangular. Specifically, each pixel unit 1 has different pixel areas/aperture ratios for the triangular red and green sub-pixels 11, 12 and for the rectangular blue sub-pixels 13. Red, green and blue organic luminescent materials have different service lives, wherein the organic luminescent material of the blue sub-pixel 13 have the shortest service life and the lowest luminous efficiency, and the red and green sub-pixels 11 and 12 have the highest luminous efficiency and the longest service life. Therefore, according to the difference in service lives and efficiency of different organic luminescent materials, different pixel area ratios are designed to achieve the best screen display effect. Furthermore, when the polygon 14 is regular octagonal, the first sub-pixel 11 and the second sub-pixel 12 are trapezoidal. When the polygon 14 is regular decagonal, the first sub-pixel 11 and the second sub-pixel 12 are polygonal.

Figure 4:
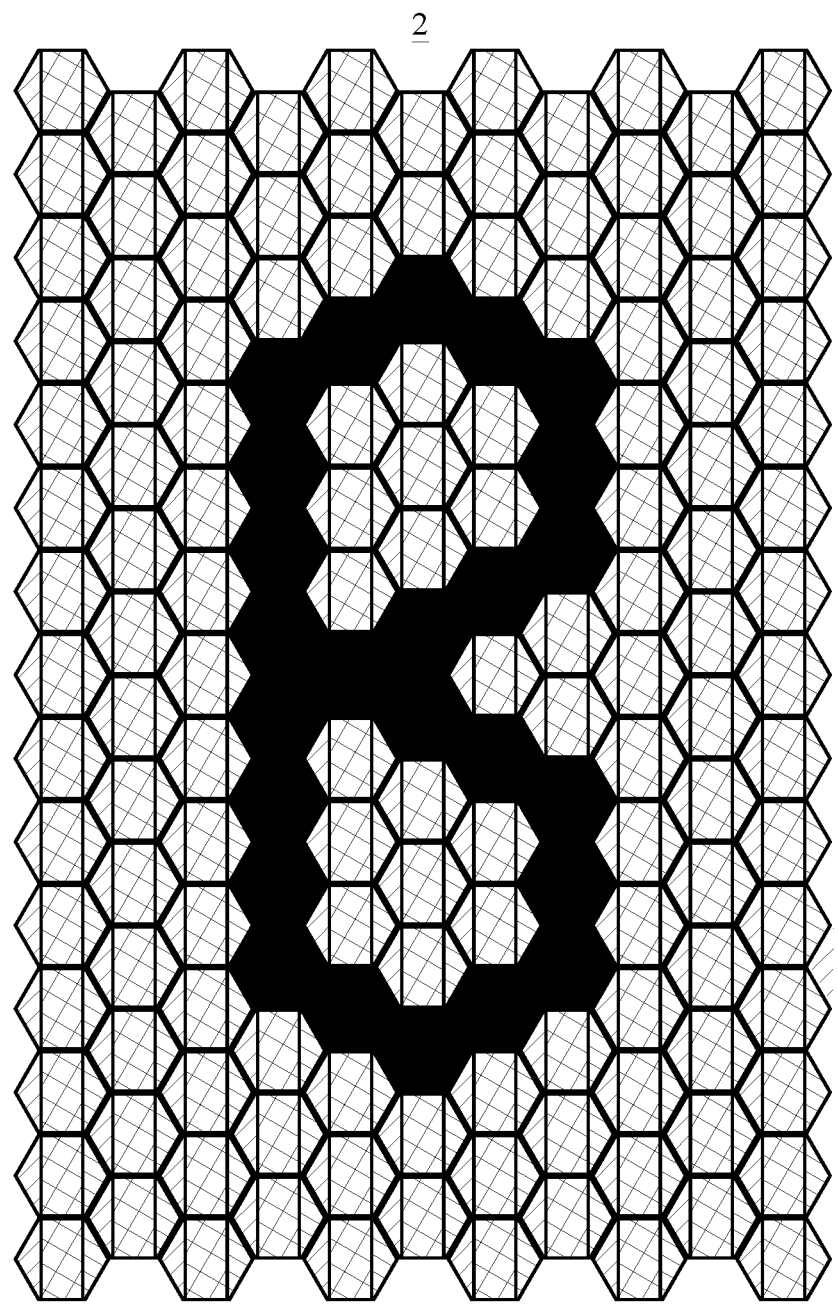
FIG. 4 is a schematic view illustrating that the pixel structure emits light according to one embodiment of the present invention.

In the embodiment shown in FIG. 5 and FIG. 6, a fourth sub-pixel 20 is arranged connected to an outer boundary of the polygon 14. When the polygon 14 is regular octagonal or regular decagonal in shape, the fourth sub-pixel 20 is connected to one side of an outer boundary of the third sub-pixel 13, wherein the fourth sub-pixel 20 is white. Also referring to FIG. 4, the pixel units 1 are linearly arranged in a longitudinal direction and a transverse direction and constitute a pixel structure 2 to form a display screen (not labelled). Furthermore, when the pixel units 1 constitute the pixel structure 2 and display a letter B, the respective sub-pixels 11, 12, 13 in one single pixel unit 1 emit light at the same time and thereby display a white color. As shown in FIG. 4, edges of the letter B are smooth, so chromatic dispersion does not occur, and there is no need for the adjacent pixel units 1 to share the sub-pixels (in order to raise a resolution), and visual perception is significantly improved compared to a conventional PenTile-type sub-pixel layout.

When the polygon 14 is regular hexagonal in shape, each of the pixel units 1 is connected to form the pixel structure 2 without a gap. When each of the polygons 14 is regular octagonal in shape, multiple fourth sub-pixels 20 are rectangular and connected to outer boundaries of the pixel units 1. When each of the polygons 14 is regular decagonal in shape, the fourth sub-pixels 20 are triangular and connected to the outer boundaries of the pixel units 1. It should be noted that, in the regular decagon shown in FIG. 6, the pixel area of the third sub-pixel 13 can be extended to two sides, and the pixel areas of the first sub-pixel 11 and the second sub-pixel 12 are reduced to triangles, thereby prolonging the service life and improving luminous efficiency of the blue luminescent material.

Referring to FIGS. 7A to 7D and FIG. 8, the present invention provides a manufacturing method of a pixel structure, comprising steps as follows.

Step S10: forming a plurality of pixel units 1 which are each in a shape of a polygon 14, each of the pixel units 1 defines a first opening area 16, a second opening area 17, and a third opening area 18;

Step S20: forming first sub-pixels by performing evaporation or inkjet printing through a first fine metal mask (not illustrated) arranged corresponding to the first opening areas 16, wherein the first fine metal mask comprises a plurality of first vapor deposition holes;

Step S30: forming second sub-pixels 12 by performing evaporation or inkjet printing through a second fine metal mask (not illustrated) arranged corresponding to the second opening areas 17, wherein the second fine metal mask (not illustrated) comprises a plurality of second vapor deposition holes; and Step S40: forming third sub-pixels 13 by performing evaporation or inkjet printing through a third fine metal mask (not illustrated) arranged corresponding to the third opening areas 18, wherein the third fine metal mask comprises a plurality of third vapor deposition holes.

Each of the third sub-pixels 13 is formed inside a rectangular boundary (not illustrated) of the polygon 14, and each of the first sub-pixels 11 and each of the second sub-pixels 12 are respectively formed on two sides of the rectangular boundary, a pixel area of each of the third sub-pixels 13 is larger than a pixel area of each of the first sub-pixels 11 and each of the second sub-pixels 12, the first sub-pixel 11 is red, the second sub-pixel 12 is green, and the third sub-pixel 13 is blue.

In some embodiments, steps S20, S30, and S40 can be interchanged in order, and the present invention is not limited in this regard. In the step of forming the pixel units 1 which are each in the shape of the polygon 14, the manufacturing method further comprises forming a pixel defining matrix 15 in each of the first sub-pixels 11, each of the second sub-pixels 12, and each of the third sub-pixels 13, wherein the polygon 14 is regular hexagonal, regular octagonal, or regular decagonal in shape.

Figure 7A:
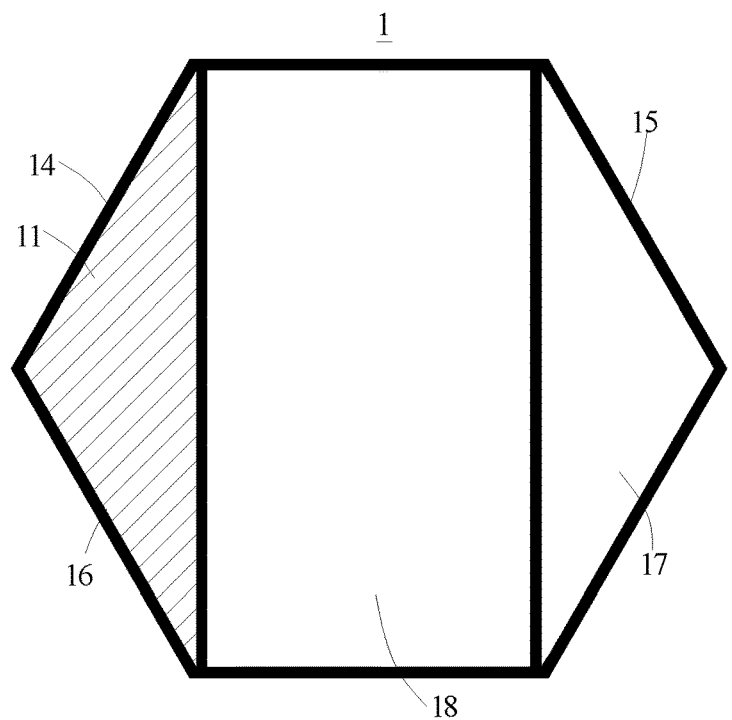
FIG. 7A is a first structural view illustrating a manufacturing method of the pixel structure according to the present invention.
Figure 7B:
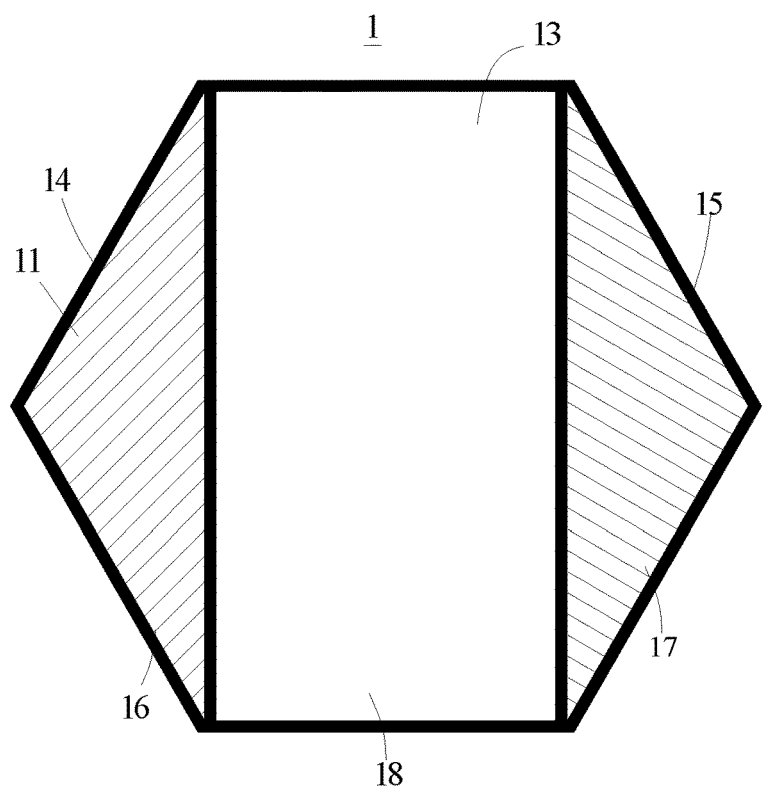
FIG. 7B is a second structural view illustrating the manufacturing method of the pixel structure according to the present invention.
Figure 7C:
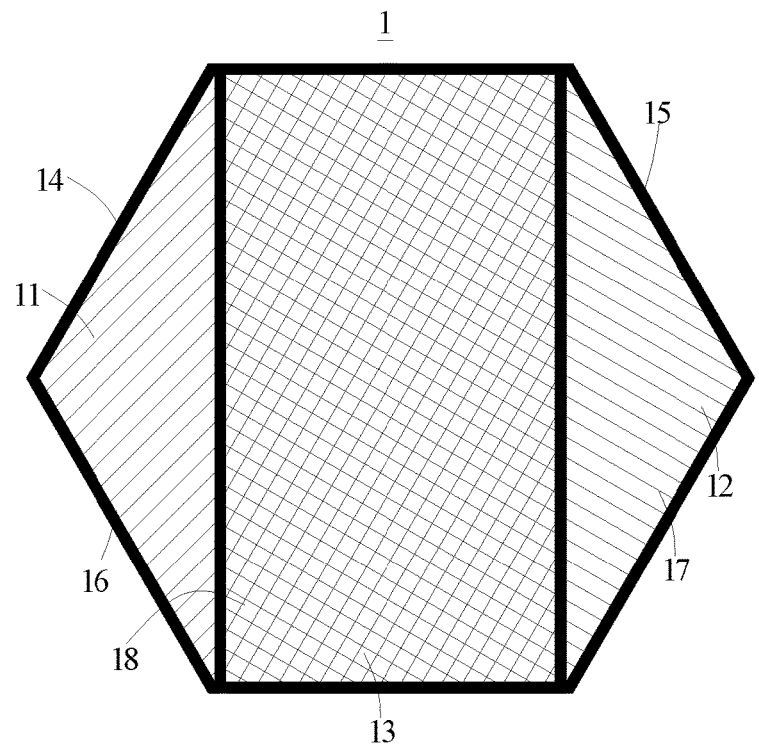
FIG. 7C is a third structural view illustrating the manufacturing method of the pixel structure according to the present invention.
Figure 7D:
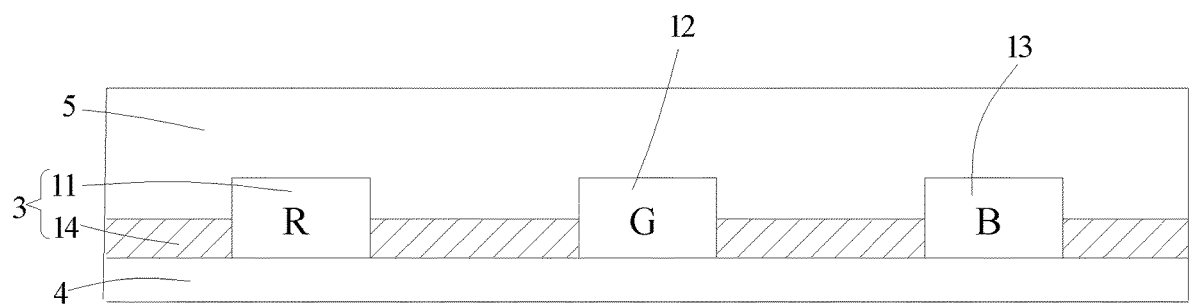
FIG. 7D is a schematic cross-sectional view illustrating the manufacturing method of the pixel structure according to the present invention.
Figure 8:
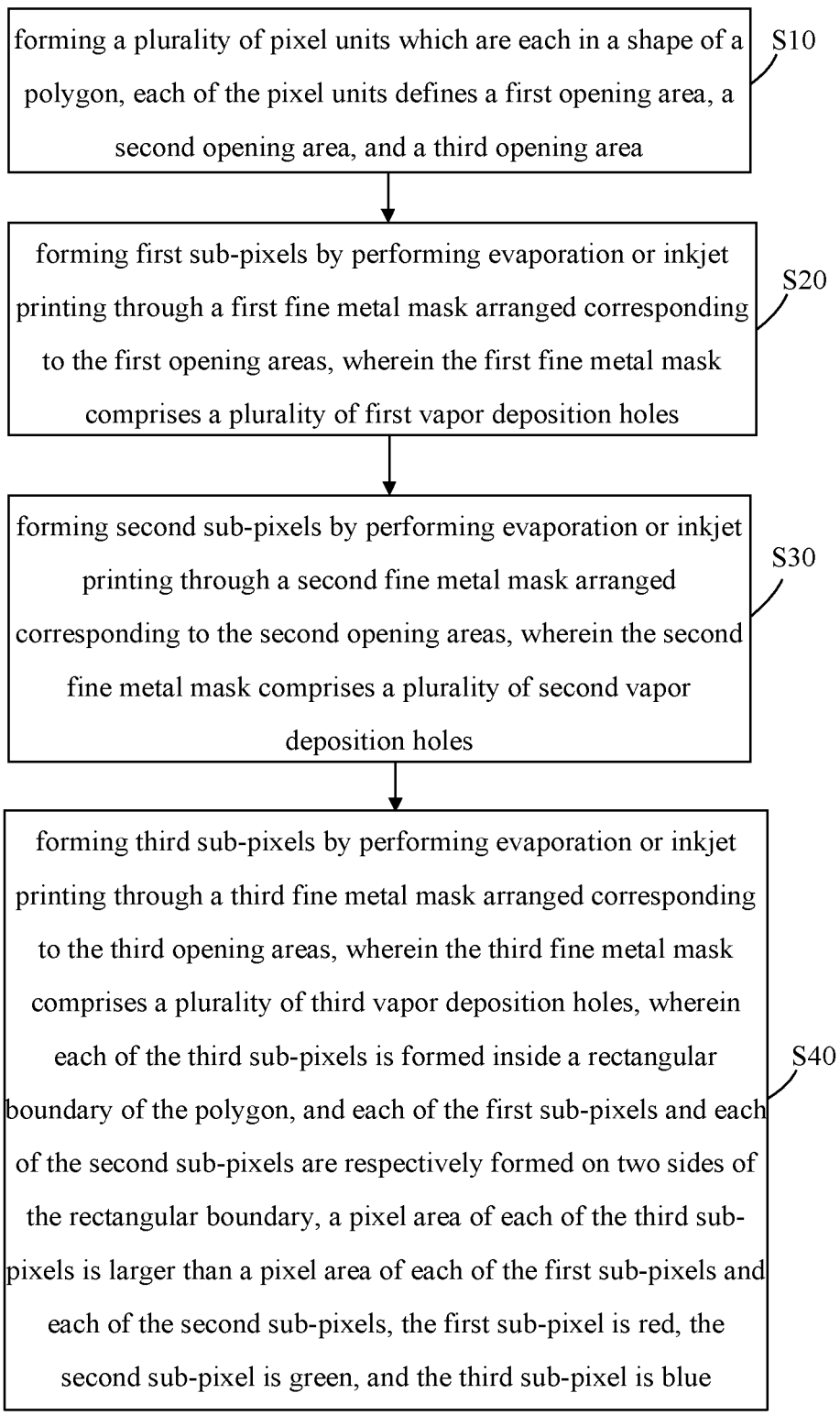
FIG. 8 is a process flow diagram illustrating the manufacturing method of the pixel structure according to the present invention.

As shown in FIG. 7D, the first sub-pixel 11, the second sub-pixel 12, and the third sub-pixel 13 in each pixel unit 1 are formed on a pixel defining layer 3. The first sub-pixel 11, the second sub-pixel 12, and the third sub-pixel 13 are spaced apart by a pixel defining matrix 15, wherein the pixel defining matrix 14 is black. Furthermore, the pixel defining layer 3 is formed on a substrate 4, and the pixel defining layer 3 is covered with, for example, a protection layer 5; however, the present invention is not limited to this embodiment. The pixel areas 16 to 18 (opening regions) of the first, second, and third sub-pixels 11 to 13 in each pixel unit 1 are formed by, for example, performing evaporation through conventional fine metal masks (FMM) having vapor deposition holes (not illustrated) of different sizes.

When the polygon 14 is regular octagonal or the regular decagonal, a plurality of fourth sub-pixels 20 are connected to outer boundaries of the pixel units 1, wherein the fourth sub-pixel 20 is white. The regular-octagonal pixel unit 1 and the regular-decagonal pixel unit 1 are different from the regular-hexagonal pixel unit 1 in that, the white sub-pixel 20 is inserted between the pixel units 1, and the white sub-pixel 20 together with the adjacent red, green and blue sub-pixels 11 to 13 forms a new pixel point, thereby forming a pixel structure 2 having the RGBW sub-pixels. Therefore, the present invention can improve brightness and color of a picture, effectively save power consumption, prolong a service life of an organic light-emitting display, and improve a pixel aperture ratio of the entire display panel.

Each of the fourth sub-pixels 20 is formed by laminating or mixing at least one luminescent material with another luminescent material, wherein the luminescent materials are of colors that can be mixed to emit white light, such as fluorescent, phosphorescent or other suitable luminescent material. In addition, in this embodiment, the vapor deposition holes for the white sub-pixels 20 are simultaneously disposed with the first vapor deposition holes, the second vapor deposition holes and the third vapor deposition holes on the respective fine metal masks, so that the red, green and blue luminescent materials are deposited and stacked in openings of the pixel defining layer 3 corresponding to the white sub-pixels 20. Therefore, compared with conventional techniques, the manufacturing method of the preset embodiment saves at least one fine metal mask, and reduces production costs and manufacturing time. Accordingly, the present invention effectively prolongs a service life and luminous efficiency of the third sub-pixel 13, and increases an aperture ratio of the overall pixel unit 1, while avoiding problems of chromatic dispersion and serrated edges.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A pixel unit, comprising:
a first sub-pixel, a second sub-pixel, and a third sub-pixel arranged to form a polygon, wherein the third sub-pixel is disposed in a rectangular boundary of the polygon, the polygon is regular hexagonal, regular octagonal, or regular decagonal in shape, the first sub-pixel and the second sub-pixel are respectively disposed at two sides of the rectangular boundary, wherein a pixel area of the third sub-pixel is larger than a pixel area of the first sub-pixel and the second sub-pixel, the first sub-pixel is red, the second sub-pixel is green, and the third sub-pixel is blue, wherein when the polygon is regular hexagonal in shape, the first sub-pixel and the second sub-pixel are triangular; when the polygon is regular octagonal in shape, the first sub-pixel and the second sub-pixel are trapezoidal; and when the polygon is regular decagonal in shape, the first sub-pixel and the second sub-pixel are polygonal.

2. The pixel unit according to claim 1, further comprising a fourth sub-pixel arranged connected to an outer boundary of the polygon, wherein when the polygon is regular octagonal or regular decagonal in shape, the fourth sub-pixel is connected to one side of the outer boundary of the third sub-pixel, wherein the fourth sub-pixel is white.

3. The pixel unit according to claim 1, further comprising a pixel defining matrix which spaces the first sub-pixel, the second sub-pixel, and the third sub-pixel apart from each other, wherein the pixel defining matrix is black.

4. A pixel unit structure, comprising multiple pixel units of claim 1, wherein each of the pixel units comprises a pixel defining matrix which spaces the first sub-pixel, the second sub-pixel, and the third sub-pixel apart from each other, wherein the pixel units are arranged linearly in a longitudinal direction and in a transverse direction.

5. The pixel structure according to claim 4, wherein the polygon is regular hexagonal, regular octagonal, or regular decagonal in shape.

6. The pixel structure according to claim 4, wherein when the polygon is regular hexagonal in shape, each of the pixel units is connected to form the pixel structure without a gap.

7. The pixel structure according to claim 4, wherein when each of the polygons is regular octagonal in shape, a plurality of fourth sub-pixels are rectangular and connected to outer boundaries of the pixel units.

8. The pixel unit according to claim 4, wherein when each of the polygons is regular decagonal in shape, a plurality of fourth sub-pixels are triangular and connected to outer boundaries of the pixel units.

9. A manufacturing method of a pixel structure, comprising steps as follows:
forming a plurality of pixel units which are each in a shape of a polygon, each of the pixel units defines a first opening area, a second opening area, and a third opening area, wherein the polygon is regular hexagonal, regular octagonal, or regular decagonal in shape;
forming first sub-pixels by performing evaporation or inkjet printing through a first fine metal mask arranged corresponding to the first opening areas, wherein the first fine metal mask comprises a plurality of first vapor deposition holes;
forming second sub-pixels by performing evaporation or inkjet printing through a second fine metal mask arranged corresponding to the second opening areas, wherein the second fine metal mask comprises a plurality of second vapor deposition holes; and
forming third sub-pixels by performing evaporation or inkjet printing through a third fine metal mask arranged corresponding to the third opening areas, wherein the third fine metal mask comprises a plurality of third vapor deposition holes;
wherein each of the third sub-pixels is formed inside a rectangular boundary of the polygon, and each of the first sub-pixels and each of the second sub-pixels are respectively formed on two sides of the rectangular boundary, a pixel area of each of the third sub-pixels is larger than a pixel area of each of the first sub-pixels and each of the second sub-pixels, the first sub-pixel is red, the second sub-pixel is green, and the third sub-pixel is blue; and
wherein when the polygon is regular hexagonal in shape, the first sub-pixel and the second sub-pixel are triangular; when the polygon is regular octagonal in shape, the first sub-pixel and the second sub-pixel are trapezoidal; and when the polygon is regular decagonal in shape, the first sub-pixel and the second sub-pixel are polygonal.

10. The manufacturing method of the pixel structure according to claim 9, wherein in the step of forming the pixel units which are each in the shape of the polygon, the manufacturing method further comprises forming a pixel defining matrix in each of the first sub-pixels, each of the second sub-pixels, and each of the third sub-pixels.

11. The manufacturing method of the pixel structure according to claim 10, wherein when the polygon is regular octagonal or regular decagonal in shape, a plurality of fourth sub-pixels is connected to outer boundaries of the pixel units.

12. The manufacturing method of the pixel structure according to claim 11, wherein the fourth sub-pixel is white, and the pixel defining matrix is black.

* * * * *